United States Patent
Sato et al.

(10) Patent No.: US 8,687,343 B2
(45) Date of Patent: Apr. 1, 2014

(54) SUBSTRATE MOUNTING TABLE OF SUBSTRATE PROCESSING APPARATUS

(75) Inventors: Tetsuji Sato, Nirasaki (JP); Takashi Kitazawa, Nirasaki (JP); Akihiro Yoshimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 330 days.

(21) Appl. No.: 12/947,214

(22) Filed: Nov. 16, 2010

(65) Prior Publication Data
US 2011/0116207 A1 May 19, 2011

Related U.S. Application Data

(60) Provisional application No. 61/296,322, filed on Jan. 19, 2010.

(30) Foreign Application Priority Data

Nov. 17, 2009 (JP) .................................. 2009-261867

(51) Int. Cl.
*H01L 21/683* (2006.01)
*C23F 1/00* (2006.01)

(52) U.S. Cl.
USPC ...................................... 361/234; 156/345.51

(58) Field of Classification Search
USPC ...................................... 361/234; 156/345.51
See application file for complete search history.

(56) References Cited

U.S. PATENT DOCUMENTS

| | | | |
|---|---|---|---|
| 5,886,863 A | 3/1999 | Nagasaki et al. | |
| 5,958,265 A | 9/1999 | Ogahara | |
| 6,117,349 A * | 9/2000 | Huang et al. | ..................... 216/71 |
| 2002/0170882 A1 | 11/2002 | Akiba | |
| 2007/0256785 A1* | 11/2007 | Pamarthy et al. | ........ 156/345.33 |
| 2007/0283891 A1 | 12/2007 | Okayama | |
| 2008/0062611 A1* | 3/2008 | Himori et al. | .................. 361/234 |
| 2008/0066868 A1* | 3/2008 | Masuda | .................... 156/345.51 |
| 2010/0002355 A1 | 1/2010 | Morooka | |

FOREIGN PATENT DOCUMENTS

| | | |
|---|---|---|
| JP | 2000-286332 | 10/2000 |
| JP | 2003-179129 A | 6/2003 |
| JP | 2004-235623 A | 8/2004 |
| JP | 2005-64460 A | 3/2005 |

OTHER PUBLICATIONS

European Search Report mailed Nov. 19, 2013 in European Patent Application No. 10191516.3, filed Nov. 17, 2010 (7 pages).

* cited by examiner

*Primary Examiner* — Scott Bauer
(74) *Attorney, Agent, or Firm* — Rothwell, Figg, Ernst & Manbeck, P.C.

(57) ABSTRACT

A substrate mounting table of a substrate processing apparatus includes a base portion and a circular plate-shaped electrostatic chuck adhered to an upper surface of the base portion by an adhesive layer. The electrostatic chuck has a circular attracting surface to support a substrate. The substrate mounting table further includes an annular focus ring arranged around the electrostatic chuck to surround the substrate and to cover an outer peripheral portion of the upper surface of the base portion. The electrostatic chuck has a two-layer structure including an upper circular part and a lower circular part having a diameter larger than that of the upper circular part. An outer peripheral portion of the lower circular part and an outer peripheral portion of the adhesive layer adhering the lower circular part to the base portion are covered with the focus ring.

7 Claims, 3 Drawing Sheets

SUBSTRATE MOUNTING TABLE OF SUBSTRATE PROCESSING APPARATUS

CROSS-REFERENCE TO RELATED APPLICATIONS

This application claims priority to Japanese Patent Application No. 2009-261867 filed on Nov. 17, 2009 and U.S. Provisional Application No. 61/296,322 filed on Jan. 19, 2010, the entire contents of which are incorporated herein by reference.

FIELD OF THE INVENTION

The present invention relates to a substrate mounting table of a substrate processing apparatus for performing a predetermined process, e.g., a film forming process and an etching process, on a substrate such as a semiconductor wafer.

BACKGROUND OF THE INVENTION

A substrate processing apparatus for performing a plasma process, e.g., an etching process, on a wafer as a substrate includes an accommodation vessel (chamber) for accommodating the wafer and a substrate mounting table, disposed in the chamber, for mounting the wafer thereon. The substrate processing apparatus generates a plasma in the chamber and performs an etching process on the wafer mounted on the substrate mounting table by the plasma.

The substrate mounting table is provided with an electrostatic chuck made of an insulating member, e.g., ceramic, and an electrostatic electrode plate is provided in the electrostatic chuck. A DC voltage is applied to the electrostatic electrode plate while an etching process is performed on the wafer, so that the wafer is attracted and held on the electrostatic chuck by Coulomb force or Johnsen-Rahbek force generated by the DC voltage.

FIG. 5 is a cross sectional view schematically showing a configuration of a substrate mounting table of a conventional substrate processing apparatus.

The substrate mounting table 70 mainly includes a base portion 71 formed of, e.g., aluminum, an electrostatic chuck (ESC) 72 disposed on an upper planar surface of the base portion 71, an adhesive layer 73 for adhering the electrostatic chuck 72 to the base portion 71, and a focus ring 75 arranged to surround the electrostatic chuck 72. A circular wafer W is mounted on an upper planar surface of the electrostatic chuck 72.

A thermally sprayed film is formed on the upper planar surface of the base portion 71 by spraying ceramic made of, e.g., alumina, yttrium or the like in order to insulate the base portion 71. Further, since it is necessary to clean the inside of the chamber by using the plasma, plasma resistance and pressure resistance are required in the electrostatic chuck 72. Thus, recently, an integrated plate chuck is preferably used as the electrostatic chuck 72. The electrostatic chuck 72 serving as a plate chuck is formed of ceramic having a thickness of about 1 mm, and an electrostatic electrode plate 74 is embedded in the electrostatic chuck 72.

The focus ring 75 is formed of, e.g., single crystalline silicon and mounted at an outer peripheral portion of the upper planar surface of the base portion 71 to surround the wafer W mounted on the electrostatic chuck 72. The focus ring 75 makes the plasma density above a peripheral portion of the wafer W substantially equal to the plasma density above a central portion of the wafer W by extending a plasma distribution region to an upper region above the focus ring 75 as well as an upper region above the wafer W. Accordingly, it is possible to maintain uniformity of an etching process being performed on the entire surface of the wafer W.

There is a gap between the electrostatic chuck 72 and the focus ring 75 in the conventional substrate mounting table. The plasma enters into the gap and a gap between the wafer W and the focus ring 75. Accordingly, there is a problem in which the adhesive layer 73 formed of an organic material is worn by irradiation of the plasma. Further, a surface 71a of the base portion 71 between the electrostatic chuck 72 and the focus ring 75 is exposed. The plasma is irradiated on the exposed surface 71a and the thermally sprayed film is worn. Then, when the aluminum of the base portion 71 is exposed, abnormal discharge (arcing) may occur. The wear of the adhesive layer 73 and the occurrence of the abnormal discharge exert a bad influence on the functions of the substrate mounting table, thereby shortening a life span of the substrate mounting table.

Accordingly, it is required to develop a substrate mounting table capable of avoiding the wear of the adhesive layer for adhering the electrostatic chuck to the base portion. There is proposed a substrate mounting table configured to cover a peripheral portion of the adhesive layer with a protective coating (see, e.g., Japanese Patent Application Publication No. 2000-286332).

However, in the substrate mounting table disclosed in Japanese Patent Application Publication No. 2000-286332, not only the adhesion portion between the electrostatic chuck main body and the base portion but also the entire electrostatic chuck main body and a part of the base portion are coated with a fluorine resin protective film as a separate member. Accordingly, the fluorine resin protective film is added as a new constituent component and there is a problem of increasing the number of components and the number of assembly steps.

SUMMARY OF THE INVENTION

In view of the above, the present invention provides a substrate mounting table of a substrate processing apparatus capable of preventing arcing (abnormal discharge) on a surface of a base portion and the wear of an adhesive layer for adhering an electrostatic chuck to the base portion due to irradiation of a plasma without increasing the number of components and the number of assembly steps.

In accordance with an embodiment of the present invention, there is provided a substrate mounting table of a substrate processing apparatus including: a base portion; a circular plate-shaped electrostatic chuck adhered to an upper surface of the base portion by an adhesive layer, the electrostatic chuck having a circular attracting surface to support a substrate; and an annular focus ring arranged around the electrostatic chuck to surround the substrate and to cover an outer peripheral portion of the upper surface of the base portion, wherein the electrostatic chuck has a two-layer structure including an upper circular part and a lower circular part having a diameter larger than that of the upper circular part, and wherein an outer peripheral portion of the lower circular part and an outer peripheral portion of the adhesive layer adhering the lower circular part to the base portion are covered with the focus ring.

With such configuration, the electrostatic chuck has a two-layer structure including the upper circular part and the lower circular part having a diameter larger than that of the upper circular part. The outer peripheral portion of the lower circular part and the outer peripheral portion of the adhesive layer adhering the lower circular part to the base portion are covered with the focus ring. Accordingly, it is possible to prevent the plasma from reaching the exposed surface of the base portion or the outer peripheral portion of the adhesive layer. Consequently, it is possible to prevent arcing (abnormal discharge) on the surface of the base portion and the wear of the adhesive layer for adhering the electrostatic chuck to the base portion due to irradiation of the plasma without increasing the number of components and the number of assembly steps.

The base portion may have a depression into which the lower circular part of the electrostatic chuck is fitted, and a fitting portion of the lower circular part and the depression is covered with the focus ring.

With such configuration, the base portion has a depression into which the lower circular part of the electrostatic chuck is fitted, and a fitting portion of the lower circular part and the depression is covered with the focus ring. Accordingly, the exposed surface of the base portion or the outer peripheral portion of the adhesive layer can be positioned at a lower portion of the fitting portion, thereby extending a plasma path toward the exposed surface of the base portion or the outer peripheral portion of the adhesive layer. Consequently, it is possible to prevent the plasma from reaching the surface of the base portion or the outer peripheral portion of the adhesive layer. As a result, it is possible to surely prevent the wear of the adhesive layer.

The focus ring may be mounted on an upper surface of the base portion surrounding the depression, and a gap between a lower surface of the focus ring and an upper surface of the lower circular part of the electrostatic chuck may be equal to or smaller than about 0.4 mm.

With such configuration, the focus ring is mounted on an upper surface of the base portion surrounding the depression, and a gap between a lower surface of the focus ring and an upper surface of the lower circular part of the electrostatic chuck is equal to or smaller than about 0.4 mm. Accordingly, it is possible to more surely prevent the plasma from reaching the surface of the base portion and the adhesive layer. Thus, it is possible to avoid the wear of the adhesive layer and the occurrence of arcing.

The focus ring may be mounted on the lower circular part of the electrostatic chuck, and a gap between a lower surface of the focus ring and an upper surface of the base portion surrounding the depression may be equal to or smaller than about 0.4 mm.

With such configuration, the focus ring is mounted on the lower circular part of the electrostatic chuck, and a gap between a lower surface of the focus ring and an upper surface of the base portion surrounding the depression is equal to or smaller than about 0.4 mm. Accordingly, it is possible to more surely prevent the plasma from reaching the surface of the base portion and the adhesive layer. Thus, it is possible to avoid the wear of the adhesive layer and the occurrence of arcing.

The focus ring may include a cutoff portion into which an outer peripheral portion of the lower circular part of the electrostatic chuck and an outer peripheral portion of the adhesive layer are loosely fitted, and a gap between an inner wall surface of the cutoff portion and the outer peripheral portions of the adhesive layer and the lower circular part is covered with the focus ring.

With such configuration, the focus ring includes a cutoff portion into which an outer peripheral portion of the lower circular part of the electrostatic chuck and an outer peripheral portion of the adhesive layer are loosely fitted, and a gap between an inner wall surface of the cutoff portion and the outer peripheral portions of the adhesive layer and the lower circular part is covered with the focus ring. Accordingly, it is possible to more surely prevent the plasma from reaching the surface of the base portion and the adhesive layer for adhering the electrostatic chuck to the base portion. Thus, it is possible to elongate a life span of the substrate mounting table.

The substrate may be a circular plate-shaped member, and the substrate partially vertically overlaps with the focus ring, an overlapping width in a radial direction of the substrate ranging from about 0.5 mm to about 1.5 mm.

With such configuration, the substrate is a circular plate-shaped member, and the substrate partially vertically overlaps with the focus ring, and wherein an overlapping width at an overlapping portion in a radial direction of the substrate ranges from about 0.5 mm to about 1.5 mm.

Accordingly, it is possible to prevent the plasma from entering into the gap between the substrate and the focus ring.

A gap between a lower surface of the substrate and an upper surface of the focus ring at the overlapping portion may be equal to or smaller than about 0.4 mm.

With such configuration, a gap between a lower surface of the substrate and an upper surface of the focus ring at the overlapping portion is equal to or smaller than about 0.4 mm. Accordingly, it is possible to prevent the plasma from entering into the gap between the substrate and the focus ring. Thus, it is possible to prevent the wear of the adhesive layer and the occurrence of arcing.

A gap between an outer peripheral surface of the upper circular part of the electrostatic chuck and an inner peripheral surface of the focus ring may range from about 0.05 mm to about 0.4 mm.

With such configuration, a gap between an outer peripheral surface of the upper circular part of the electrostatic chuck and an inner peripheral surface of the focus ring ranges from about 0.05 mm to about 0.4 mm. Accordingly, it is possible to prevent the plasma from entering into the gap between the electrostatic chuck and the focus ring.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings which form a part hereof.

Figure 1:
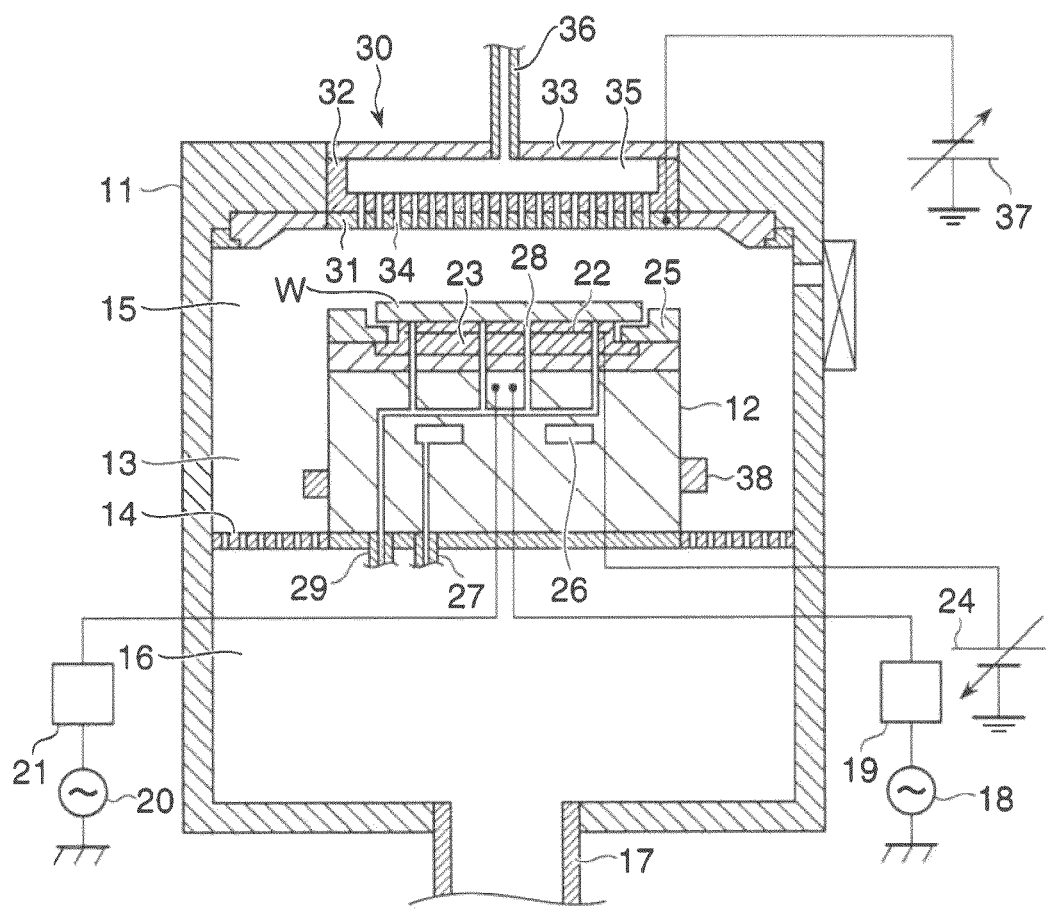
FIG. 1 is a cross sectional view schematically showing a configuration of a substrate processing apparatus including a substrate mounting table in accordance with an embodiment of the present invention.

FIG. 1 is a cross sectional view schematically showing a configuration of a substrate processing apparatus including a substrate mounting table in accordance with an embodiment of the present invention. The substrate processing apparatus performs a plasma etching process on a wafer for semiconductor devices (hereinafter, simply referred to as "wafer") as a substrate.

In FIG. 1, a substrate processing apparatus 10 has a chamber 11 for accommodating a wafer W, and a cylindrical substrate mounting table (hereinafter, referred to as "susceptor") 12 for mounting the wafer W thereon is provided in the chamber 11. In the substrate processing apparatus 10, a side exhaust path 13 is defined by an inner sidewall of the chamber 11 and a side surface of the susceptor 12. A gas exhaust plate 14 is provided in the side exhaust path 13.

The gas exhaust plate 14 is a plate-shaped member having through holes and functions as a partition plate for dividing the inside of the chamber 11 into an upper portion and a lower portion. In an inner upper portion (hereinafter, referred to as "processing space") 15 of the chamber 11 defined by the gas exhaust plate 14, a plasma is generated as will be described later. Further, a gas exhaust pipe 17 for discharging gas in the chamber 11 is connected to an inner lower portion (hereinafter, referred to as "gas exhaust space (manifold)") 16 of the chamber 11. The gas exhaust plate 14 prevents the plasma from leaking into the manifold 16 by blocking or reflecting the diffusion of the plasma generated in the processing space 15.

A turbo molecular pump (TMP) and a dry pump (DP) (both are not shown) are connected to the gas exhaust pipe 17, and the chamber 11 can be vacuum exhausted to a predetermined pressure by the pumps. The pressure of the chamber 11 is controlled by an automatic pressure control (APC) valve (not shown).

A first high frequency power supply 18 is connected to the susceptor 12 in the chamber 11 via a first matching unit 19. Further, a second high frequency power supply 20 is connected to the susceptor 12 via a second matching unit 21. The first high frequency power supply 18 applies a high frequency power for bias with a relative low frequency, e.g., 2 MHz, to the susceptor 12. The second high frequency power supply 20 applies a high frequency power for plasma generation with a relative high frequency, e.g., 60 MHz, to the susceptor 12. Accordingly, the susceptor 12 serves as a lower electrode. Further, the first matching unit 19 and the second matching unit 21 maximize an efficiency of the high frequency power applied to the susceptor 12 by reducing the reflection of the high frequency power from the susceptor 12.

An electrostatic chuck 23 having an electrostatic electrode plate 22 therein is placed on the susceptor 12. The electrostatic chuck 23 is formed of ceramic, and has a two-layer structure in which a lower circular part has a larger diameter than that of an upper circular part.

A DC power supply 24 is connected to the electrostatic electrode plate 22. When a positive DC voltage is applied to the electrostatic electrode plate 22, a negative potential is generated at a surface (hereinafter, referred to as "backside") of the wafer W facing the electrostatic chuck 23. Accordingly, a potential difference is generated between the electrostatic electrode plate 22 and the backside of the wafer W, so that the wafer W is attracted and held on the electrostatic chuck 23 by Coulomb force or Johnsen-Rahbek force caused by the potential difference.

A focus ring 25 is arranged to surround the wafer W attracted and held on the electrostatic chuck 23. The focus ring 25 is formed of, e.g., silicon (Si), silicon carbide (SiC) or the like.

An annular coolant path 26 extending, e.g., in a circumferential direction is provided in the susceptor 12. A low-temperature coolant, e.g., cooling water or Galden (registered trademark) is circulated and supplied into the coolant path 26 from a chiller unit (not shown) via a coolant line 27. The susceptor 12 that has been cooled by the coolant cools the wafer W and the focus ring 25 through the electrostatic chuck 23.

Heat transfer gas supply holes 28 are formed to be opened at a portion (hereinafter, referred to as "attracting surface") of the electrostatic chuck 23 on which the wafer W is attracted and held. The heat transfer gas supply holes are connected to a heat transfer gas supply unit (not shown) via a heat transfer gas supply line 29. The heat transfer gas supply unit supplies, e.g., helium (He) gas serving as a heat transfer gas to a gap between the attracting surface and the backside of the wafer W through the heat transfer gas supply holes 28. The He gas supplied to the gap between the attracting surface and the backside of the wafer W effectively transfers the heat of the wafer W to the electrostatic chuck 23.

A shower head 30 is arranged at a ceiling portion of the chamber 11 to face the susceptor 12. The shower head 30 has an upper electrode plate 31, a cooling plate 32 for detachably holding the upper electrode plate 31, and a cover 33 for covering the cooling plate 32. The upper electrode plate 31 is formed of a circular plate-shaped member having gas holes 34 formed therethrough in its thickness direction and made of, e.g., silicon as a semiconductor material. Further, a buffer room 35 is provided in the cooling plate 32, and a gas inlet line 36 is connected to the buffer room 35.

Further, a DC power supply 37 is connected to the upper electrode plate 31 of the shower head 30, and a negative DC voltage is applied to the upper electrode plate 31. In this case, the upper electrode plate 31 emits secondary electrons by collision of positive ions, thereby preventing reduction in electron density above the wafer W in the processing space 15. The emitted secondary electrons flow from a region above the wafer W to a ground electrode (ground ring) 38 formed of a semiconductor material such as silicon carbide or silicon and provided to surround the side surface of the susceptor 12 in the side exhaust path 13.

In the substrate processing apparatus 10 having the above configuration, a processing gas supplied from the gas inlet line 36 to the buffer room 35 is introduced into the processing space 15 through the gas holes 34. The introduced processing gas is excited by a high frequency power for plasma generation applied to the processing space 15 from the second high frequency power supply 20 via the susceptor 12, and converted into a plasma. Ions in the plasma are attracted toward the wafer W by the high frequency power for bias applied to the susceptor 12 from the first high frequency power supply 18, thereby performing an etching process on the wafer W.

An operation of each component of the substrate processing apparatus 10 is controlled by a CPU of a controller (not shown) of the substrate processing apparatus 10 according to a program corresponding to a plasma etching process.

Figure 2:
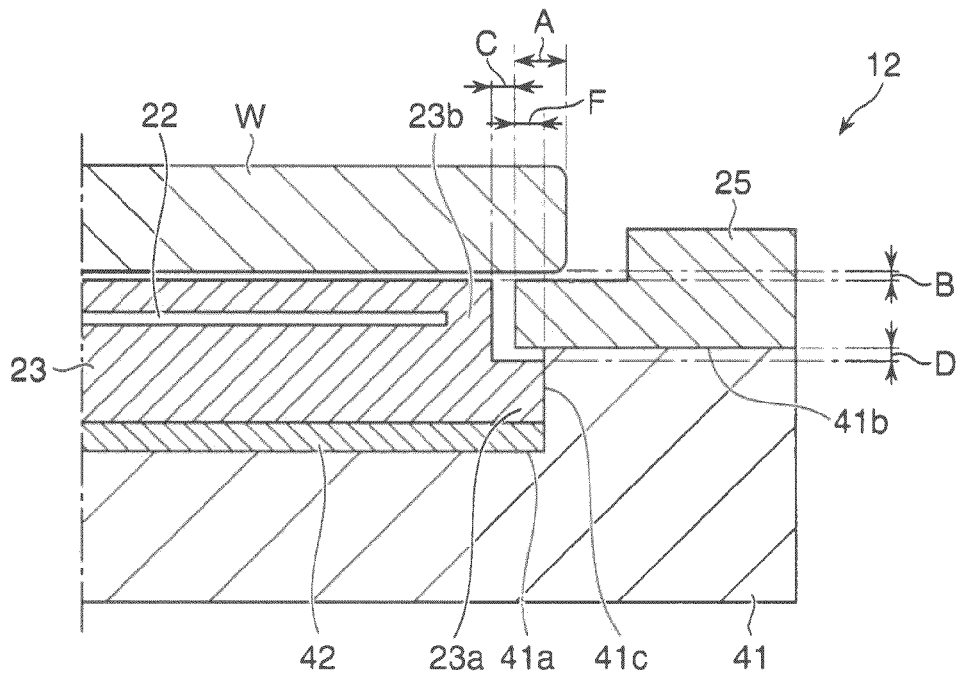
FIG. 2 illustrates a partial cross sectional view showing the substrate mounting table of FIG. 1.

FIG. 2 illustrates a partial cross sectional view showing the substrate mounting table of FIG. 1.

In FIG. 2, the susceptor 12 mainly includes a base portion (hereinafter, referred to as "metal base") 41, the circular plate-shaped electrostatic chuck 23 adhered to an upper surface of the metal base 41 via an adhesive layer 42 and having circular attracting surface for supporting the wafer W, and the annular focus ring 25 arranged around the electrostatic chuck 23 to surround the wafer W.

The electrostatic chuck 23 has a two-layer structure (hat shape) in which a lower circular part 23a has a larger diameter than that of an upper circular part 23b. The thickness of each of the lower circular part 23a and the upper circular part 23b is, e.g., about 1 mm. The metal base 41 is a cylindrical member formed of aluminum covered with a thermally sprayed film of ceramic. The metal base 41 has at upper its surface a depression 41a into which the lower circular part 23a of the electrostatic chuck 23 is fitted. The lower circular part 23a of the electrostatic chuck 23 is fitted into the depression 41a of the metal base 41 and adhered to a bottom planar surface of the depression 41a by the adhesive layer 42.

The focus ring 25 is mounted on an upper planar surface 41b surrounding the depression 41a of the metal base 41 to cover the upper planar surface 41b. An inner peripheral portion of the focus ring 25 is protruded inwardly from an inner peripheral end of the upper planar surface 41b of the metal base 41. An outer peripheral portion of the lower circular part 23a of the electrostatic chuck 23 fitted into the depression 41a and an outer peripheral portion of the adhesive layer 42 are covered with the focus ring 25. That is, a fitting portion 41c of the lower circular part 23a of the electrostatic chuck 23 and the depression 41a of the metal base 41 is covered with the focus ring 25. In this case, an overlapping width F between the lower circular part 23a of the electrostatic chuck 23 and the focus ring 25 in a radial direction of the electrostatic chuck 23 is equal to or larger than, e.g., about 0.5 mm. An effect of preventing the plasma from entering is increased by making the overlapping width F equal to or larger than, e.g., about 0.5 mm.

A sum of the thickness of the lower circular part 23a of the electrostatic chuck 23 and the thickness of the adhesive layer 42 is slightly smaller than the depth of the depression 41a of the metal base 41. Accordingly, there is a gap D between a lower surface of the focus ring 25 mounted on the upper planar surface 41b surrounding the depression 41a of the metal base 41 and an upper surface of the lower circular part 23a of the electrostatic chuck 23. The gap D is equal to or smaller than, e.g., about 0.4 mm. If the gap D exceeds about 0.4 mm, an effect of preventing the plasma from entering cannot be sufficiently obtained.

By providing the gap between the lower surface of the focus ring 25 mounted on the upper planar surface 41b of the metal base 41 and the upper surface of the lower circular part 23a of the electrostatic chuck 23, it is possible to absorb manufacturing tolerance in the manufacture of the components and ensure assembling efficiency. For example, if the upper planar surface 41b of the metal base 41 is made to be flush with the upper planar surface of the lower circular part 23a of the electrostatic chuck 23, even when the focus ring 25 is intended to be in contact with both the upper planar surface 41b of the metal base 41 and the upper planar surface of the lower circular part 23a of the electrostatic chuck 23 at the same time, the upper planar surface 41b and the upper surface of the lower circular part 23a do not have the same vertical position due to dimension errors. Accordingly, it is difficult to achieve favorable assembly.

The wafer W is a circular plate shaped member made of, e.g., silicon. The wafer W partially overlaps with the focus ring 25 in the vertical direction. That is, an outer peripheral portion of the wafer W overlaps with an inner peripheral portion of the focus ring 25 in the vertical direction. An overlapping width A at one overlapping portion in a radial direction of the wafer W ranges from about 0.5 mm to about 1.5 mm. If the overlapping width A is smaller than about 0.5 mm, the effect of preventing the plasma from entering is insufficient. If the overlapping width A is larger than about 1.5 mm, a contact area between the electrostatic chuck 23 and the wafer W becomes relatively small, thereby reducing heat transfer efficiency in control of the temperature of the wafer W. If the overlapping width A ranges from about 0.5 mm to about 1.5 mm, it is possible to prevent the plasma from entering into the gap between the wafer W and the focus ring 25 without reduction in heat transfer efficiency.

A vertical gap B between the wafer W and the focus ring 25 at the overlapping portion of the wafer W and the focus ring 25 is equal to or smaller than, e.g., about 0.4 mm. If the gap is larger than about 0.4 mm, the effect of preventing the plasma from entering is insufficient. If the gap is equal to or smaller than about 0.4 mm, it is possible to effectively prevent the plasma from entering. In this case, the lower surface of the wafer W may be in contact with the upper surface of the focus ring 25, but it is preferable to ensure a small gap of, e.g., about 0.1 mm in order to avoid damage due to stress caused by a normal force from the upper surface of the focus ring 25.

A gap C between an outer peripheral surface of the upper circular part 23b of the electrostatic chuck 23 and an inner peripheral surface of the focus ring 25 in the radial direction is equal to or smaller than, e.g., about 0.4 mm, preferably, from about 0.05 mm to about 0.4 mm. If the gap C exceeds about 0.4 mm, the effect of preventing the plasma from entering is reduced. Further, if the gap C is smaller than about 0.05 mm, the outer peripheral surface of the upper circular part 23b of the electrostatic chuck 23 and the inner peripheral surface of the focus ring 25 may be in contact with each other, thereby causing damage to the surfaces. If the gap C ranges from about 0.05 mm to about 0.4 mm, it is possible to prevent the plasma from entering into the gap while preventing damage due to contact. The same is also applied to a gap D formed between the lower surface of the focus ring 25 and the upper surface of the lower circular part 23a in FIG. 2.

In accordance with the present embodiment, the electrostatic chuck 23 includes the upper circular part 23b and the lower circular part 23a having a larger diameter than that of the upper circular part 23b, the lower circular part 23a is fitted into the depression 41a of the metal base 41, and an fitting portion 41c is covered with the focus ring 25. Accordingly, the surface of the metal base 41 (bottom surface of the depression 41a) and the outer peripheral portion of the adhesive layer 42 can be positioned below the fitting portion 41c of the lower circular part 23a and the depression 41a, thereby extending a plasma path toward the surface of the metal base 41 and the outer peripheral portion of the adhesive layer 42. Consequently, it is possible to prevent the plasma from reaching the surface of the metal base 41 and the outer peripheral portion of the adhesive layer 42. As a result, it is possible to prevent the wear of the adhesive layer 42 and the occurrence of arcing on the surface of the metal base 41 without adding another component.

In other words, in accordance with the present embodiment, the wafer W partially overlaps with the focus ring 25 in the vertical direction. The gap B formed between the wafer W and the focus ring 25 and extended in the radial direction, the gap C formed between the outer peripheral surface of the upper circular part 23b of the electrostatic chuck 23 and the inner peripheral surface of the focus ring 25 and extended in the vertical direction, and the gap D formed between the lower surface of the focus ring 25 and the upper surface of the lower circular part 23a of the electrostatic chuck 23 are made to be equal to or smaller than, e.g., about 0.4 mm. Accordingly, the gaps formed between the wafer W and the focus ring 25 and between the electrostatic chuck 23 and the focus ring 25 to communicate with a space above the wafer W are made to have a labyrinth structure. Thus, it is possible to prevent the plasma from reaching the surface of the metal base 41 or the adhesive layer 42 through the gaps when a plasma process is performed on the wafer W, and to prevent the wear of the adhesive layer 42 and the occurrence of arcing on the surface of the metal base 41, thereby preventing damage to the surfaces. Further, it is possible to prevent the metal contamination and the generation of particles due to arcing.

Further, in accordance with the present embodiment, since the lower circular part 23a of the electrostatic chuck 23 is fitted into the depression 41a of the metal base 41, although a little large amount of adhesive is coated on the lower surface of the lower circular part 23a of the electrostatic chuck 23, it can be absorbed by a tiny gap between the lower circular part 23a and an inner wall surface of the depression 41a. Accordingly, it is unnecessary to precisely adjust an amount of the coated adhesive. Further, assembling efficiency of the susceptor is improved and it is possible to prevent the generation of particles caused by peeling of the surplus adhesive.

Further, in accordance with the present embodiment, the adhesion portion of the electrostatic chuck 23 and the metal base 41 has a buried structure. Accordingly, as the focus ring 25, a conventional one may be still used.

In the present embodiment, a heater may be buried in the electrostatic chuck 23 to control the temperature of the wafer W at a location closer to the wafer W. When the heater is buried in the electrostatic chuck 23, the electrostatic chuck 23 has a thickness larger than that of a conventional electrostatic chuck having no heater, but it is made easier to form the electrostatic chuck 23 of a two-layer structure including the lower circular part 23a having a large diameter and the upper circular part 23b having a small diameter. Further, by forming the electrostatic chuck 23 of a two-layer structure, it becomes easier to cover the lower circular part 23a with the thin focus ring 25 having an absolute thickness of, e.g., about 3 mm. Accordingly, it is possible to prevent the plasma from reaching the metal base 41 and the adhesive layer 42 and prolong a life span of the substrate mounting table.

Further, in accordance with the present embodiment, the electrostatic chuck 23 has a two-layer structure (hat shape) including the lower circular part 23a and the upper circular part 23b. Accordingly, a boundary of heat transfer in the electrostatic chuck 23 can be moved to the outer side of the susceptor 12 compared to a conventional case. Consequently, heat transfer efficiency is improved and it becomes easier to ensure thermal uniformity in the electrostatic chuck 23 and the wafer W.

In the present embodiment, since the lower circular part 23a of the electrostatic chuck 23 is fitted into the depression 41a of the metal base 41, although thermal expansion of the lower circular part 23a of the electrostatic chuck 23 is restricted by the depression 41a of the metal base 41, no thermal stress is generated therebetween because the metal base 41 has a larger thermal expansion coefficient than that of the lower circular part 23a. Accordingly, it is possible to maintain accuracy of the substrate mounting surface by avoiding deformation or damage of the electrostatic chuck 23 due to thermal stress.

In the present embodiment, a spacer may be interposed between the lower surface of the lower circular part 23a of the electrostatic chuck 23 and the bottom surface of the depression 41a of the metal base 41 in order to render the thickness of the adhesive layer 42 uniform. For example, ceramic beads may be used as the spacer.

Next, a modification example of the above embodiment of the present invention will be described.

Figure 3:
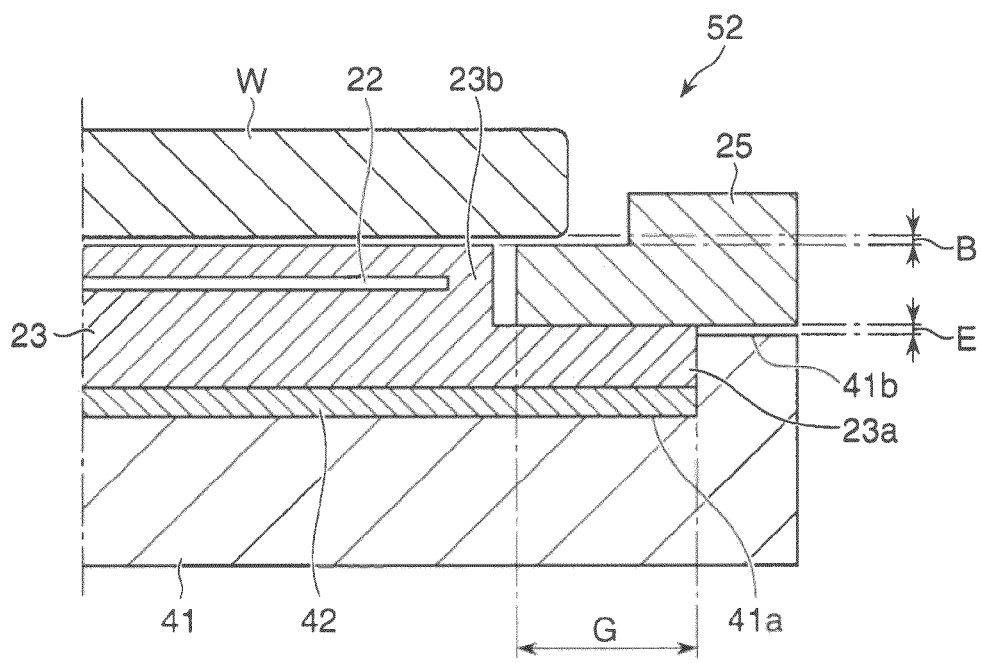
FIG. 3 illustrates a partial cross sectional view showing a substrate mounting table in a modification example of the embodiment of the present invention.

FIG. 3 illustrates a partial cross sectional view showing a substrate mounting table in the modification example.

Referring to FIG. 3, a substrate mounting table 52 is different from the substrate mounting table 12 of FIG. 2 in that the lower circular part 23a of the electrostatic chuck 23 has a diameter much larger than that of the upper circular part 23b. In other words, in the substrate mounting table 52, the outer peripheral surface of the lower circular part 23a is more protruded from the outer peripheral surface of the upper circular part 23b in comparison to the substrate mounting table 12 of FIG. 2, and the focus ring 25 is mounted on the protruded portion of the lower circular part 23a.

In accordance with the modification example, since the focus ring 25 is mounted on the lower circular part 23a of the electrostatic chuck 23, only the electrostatic chuck 23 is interposed between the wafer W and the focus ring 25 when determining the position of the wafer W with respect to the focus ring 25. Accordingly, it is possible to more accurately determine the position of the wafer W and obtain a stable dimension of the gap B formed between the wafer W and the focus ring 25. Further, it is possible to avoid a positioning error caused by accumulation of manufacturing tolerances of the constituent components.

In the modification example, an overlapping width G at an overlapping portion of the focus ring 25 and the lower circular part 23a in a radial direction of the electrostatic chuck 23 ranges, e.g., from about 1 mm to about 30 mm. Accordingly, the focus ring 25 can be stably supported by the electrostatic chuck 23.

In the modification example, a gap E formed between the lower planar surface of the focus ring 25 and the upper planar surface 41b of the metal base 41 is equal to or smaller than, e.g., about 0.4 mm in the same manner as the gap D formed between the lower surface of the focus ring 25 and the upper surface of the lower circular part 23a in FIG. 2. Accordingly, it is possible to prevent the plasma from entering into the gap E.

Next, another modification example of the above embodiment of the present invention will be described.

Figure 4:
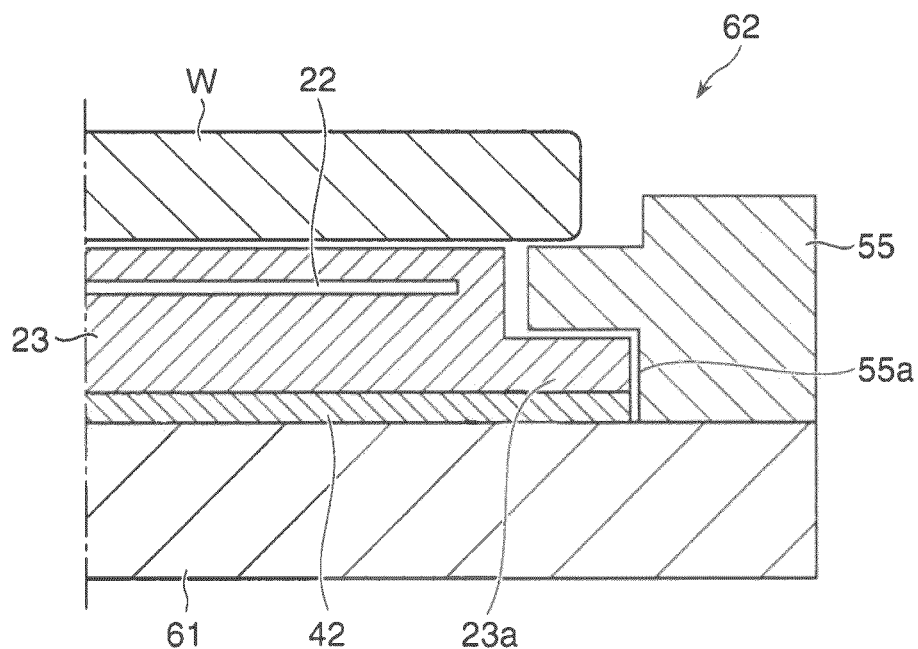
FIG. 4 illustrates a partial cross sectional view showing a substrate mounting table in another modification example of the embodiment of the present invention.
Figure 5:
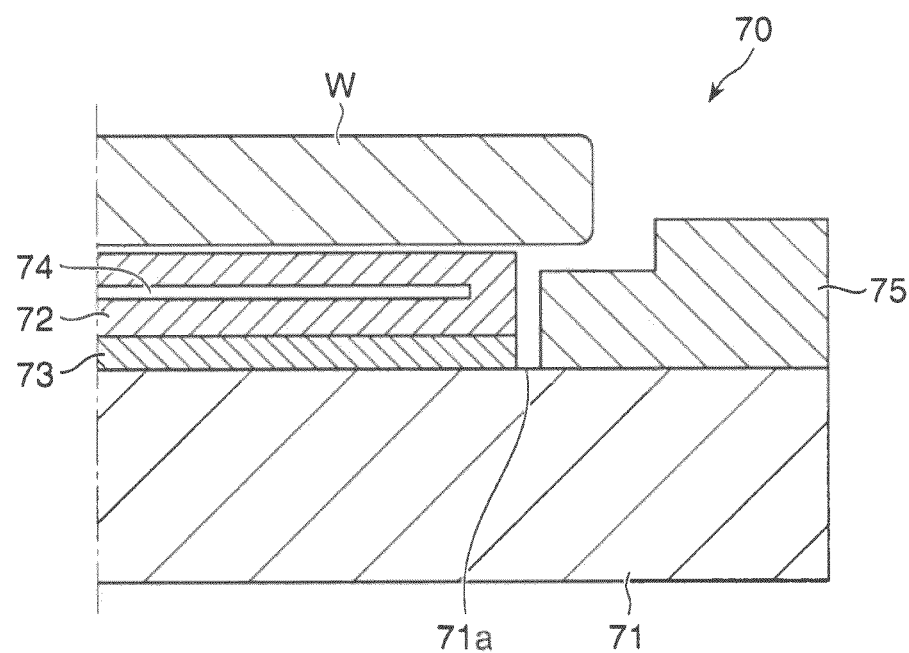
FIG. 5 is a cross sectional view schematically showing a configuration of a conventional substrate mounting table.

FIG. 4 illustrates a partial cross sectional view showing a substrate mounting table in accordance with another modification example of the above embodiment of the present invention.

Referring to FIG. 4, a substrate mounting table 62 is different from the substrate mounting table 12 of FIG. 2 in that a metal base 61 is configured to have an upper flat surface without a depression into which the electrostatic chuck 23 is fitted, and the focus ring 55 includes a cutoff portion 55a into which the outer peripheral portion of the lower circular part 23a of the electrostatic chuck 23 and the outer peripheral portion of the adhesive layer 42 are fitted, so that the outer peripheral portion of the lower circular part 23a of the electrostatic chuck 23 and the outer peripheral portion of the adhesive layer 42 are loosely fitted into the cutoff portion 55a.

In the another modification example, a gap between an inner wall surface of the cutoff portion 55a of the focus ring 55 and the outer peripheral portions of the adhesive layer 42 and the lower circular part 23a of the electrostatic chuck 23 is covered with the focus ring 55, thereby preventing the plasma from entering into the gap. Consequently, it is possible to prevent the occurrence of arcing on the surface of the metal base 61 or the wear of the adhesive layer 42 due to irradiation of the plasma.

In the above embodiment and the modification examples, the substrate that undergoes a plasma process is not limited to a wafer for semiconductor devices. For example, the present invention may be applied to various substrates for a liquid crystal display (LCD) and a flat panel display (FPD), a photomask, a CD substrate, a printed substrate or the like.

While the invention has been shown and described with respect to the embodiments, it will be understood by those skilled in the art that various changes and modification may be made without departing from the scope of the invention as defined in the following claims.

What is claimed is:

1. A substrate mounting table of a substrate processing apparatus comprising:
   a base portion;
   a circular plate-shaped electrostatic chuck adhered to an upper surface of the base portion by an adhesive layer, the electrostatic chuck having a circular attracting surface to support a substrate; and
   an annular focus ring arranged around the electrostatic chuck to surround the substrate and to cover an outer peripheral portion of the upper surface of the base portion,
   wherein the electrostatic chuck has a two-layer structure including an upper circular part and a lower circular part having a diameter larger than that of the upper circular part,
   wherein the base portion has a depression in which the lower circular part of the electrostatic chuck is disposed, and
   wherein a gap is located between a side surface of the lower circular part disposed in the depression and an inner wall surface of the depression, and wherein the gap and an outer peripheral portion of the adhesive layer adhering the lower circular part to the base portion are hidden under the focus ring when viewing the electrostatic chuck from a substrate side.

2. The substrate mounting table of claim 1, wherein the focus ring is mounted on an upper surface of the base portion surrounding the depression, and a gap greater than 0 mm and equal to or smaller than about 0.4 mm exists between a lower surface of the focus ring and an upper surface of the lower circular part of the electrostatic chuck.

3. The substrate mounting table of claim 1, wherein the focus ring is mounted on the lower circular part of the electrostatic chuck, and a gap greater than 0 mm and equal to or smaller than about 0.4 mm exists between a lower surface of the focus ring and an upper surface of the base portion surrounding the depression.

4. The substrate mounting table of claim 1, wherein the focus ring includes a cutoff portion into which an outer peripheral portion of the lower circular part of the electrostatic chuck and an outer peripheral portion of the adhesive layer are loosely inserted and fitted, and a gap between an inner wall surface of the cutoff portion and the outer peripheral portions of the adhesive layer and the lower circular part is hidden under the focus ring when viewing the electrostatic chuck from the substrate side.

5. The substrate mounting table of claim 1, wherein the substrate is a circular plate-shaped member, and the substrate partially vertically overlaps with the focus ring, an overlapping width of the overlapping portion in a radial direction of the substrate ranging from about 0.5 mm to about 1.5 mm.

6. The substrate mounting table of claim 5, wherein a gap between a lower surface of the substrate and an upper surface of the focus ring at the overlapping portion is equal to or smaller than about 0.4 mm.

7. The substrate mounting table of claim 1, wherein a gap between an outer peripheral surface of the upper circular part of the electrostatic chuck and an inner peripheral surface of the focus ring ranges from about 0.05 mm to about 0.4 mm.

* * * * *